United States Patent [19]
Misek

[11] Patent Number: 5,926,353
[45] Date of Patent: Jul. 20, 1999

[54] METHOD FOR PROTECTING MIXED SIGNAL CHIPS FROM ELECTROSTATIC DISCHARGE

[75] Inventor: Brian J. Misek, Ft. Collins, Colo.

[73] Assignee: Hewlett-Packard Co., Palo Alto, Calif.

[21] Appl. No.: 09/033,034

[22] Filed: Mar. 2, 1998

[51] Int. Cl.$^6$ ....................................................... H02H 9/00
[52] U.S. Cl. .............................................. 361/56; 361/111
[58] Field of Search .................................. 361/18, 56, 91, 361/111, 119

[56] References Cited

U.S. PATENT DOCUMENTS

| 5,301,084 | 4/1994 | Miller | 361/91 |
| 5,616,943 | 4/1997 | Nguyen et al. | 257/355 |

*Primary Examiner*—Ronald W. Leja

[57] ABSTRACT

An electrostatic discharge (ESD) protection device for an integrated circuit (IC) is presented which has both digital and analog I/O pads. The ESD protection device employs a separate ESD power supply bus capacitively coupled to the digital power supply bus and the analog power supply bus. An ESD event trigger is coupled between the ESD power supply bus and the analog ground substrate of the IC. The ESD event trigger detects ESD events, which are manifested by high-voltage high-current spikes present on the ESD power supply bus. A shunting device is coupled between the ESD power supply bus and analog ground substrate, and is responsive to the detection of an ESD event by the ESD event trigger by electrically connecting the ESD power supply bus and said analog ground substrate. Each I/O pad is capacitively coupled to the ESD power supply bus in order to protect any internal circuitry that is coupled to the I/O pad from damage due to ESD events. Protected internal circuitry is coupled to either the digital power supply bus and digital ground substrate, or the analog power supply bus and analog ground substrate, but is electrically isolated from the ESD power supply bus.

19 Claims, 3 Drawing Sheets

METHOD FOR PROTECTING MIXED SIGNAL CHIPS FROM ELECTROSTATIC DISCHARGE

FIELD OF THE INVENTION

The present invention relates generally to electro-static discharge (ESD) protection in electronic circuits, and, more particularly, to ESD protection of mixed digital and analog integrated circuits.

BACKGROUND OF THE INVENTION

Electro-static discharge (ESD) is a phenomenon which is known to irreparably damage electronic components. An ESD event, which is manifested as a surge of high-voltage, high-current electricity, is commonly generated between the human body and ground. Electrostatic potentials of 4 KV are not uncommon. Typically the discharge occurs within a few hundreds of nanoseconds and generates peak currents in the amperes. Past solutions to the protection of electronic components from ESD have typically relied on Si clamping diodes, Zener diodes, and Silicon-controlled rectifiers (SCRs).

Input and output (I/O) pads of integrated circuits (ICs), due to their connection to internal circuitry, are particularly susceptible to ESD event exposure. Conventionally, in a semiconductor device, ESD protection circuitry is connected between each of the I/O pads and the power supply bus. When a destructive ESD event occurs on an I/O pad of the semiconductor device, the ESD protection circuitry conducts the destructive ESD current away from internal circuitry of the semiconductor device to the power supply bus, thereby preventing the destructive ESD current on an I/O pad from damaging the semiconductor device.

Typical ESD protection circuitry in a semiconductor device comprises a pair of silicon controlled rectifiers (SCRs) coupled to each input or output, and to the power supply bus in the semiconductor device. When a voltage differential greater than the ESD breakdown voltage of the SCR occurs between an input or output, and the power supply bus, one of the SCRs breaks down and discharges the ESD, therethrough, to the power supply bus. For effective ESD protection, the ESD breakdown voltage of the SCRs must be lower than the ESD breakdown voltage of the input or output circuitry in the semiconductor device. This insures that the SCRs will breakdown before the input or output circuitry is damaged by an ESD event occurring on the I/O pad.

Typically, the power supply bus is configured as a ring around the entire IC. In a mixed digital and analog IC, the power supply bus becomes a point for coupling noise from digital circuitry into sensitive analog components. This is unacceptable for performance purposes.

Accordingly, there is a need to provide effective ESD protection for mixed mode ICs which effectively prevent the coupling of digital noise into the analog areas of the chip, and which does not require relatively large areas of chip space.

SUMMARY OF THE INVENTION

The present invention solves the problems of prior art ESD protection devices for integrated circuits (IC)s which have both digital and analog I/O pads by utilizing a separate ESD power supply bus. The separate ESD power supply bus is capacitively coupled to the digital power supply bus and the analog power supply bus on the chip. An ESD event trigger is coupled between the ESD power supply bus and the analog ground substrate of the IC. The ESD event trigger detects ESD events, which are manifested by a rapidly rising voltage spike present on the ESD power supply bus. A shunting device is coupled between the ESD power supply bus and analog ground substrate, and is responsive to the detection of an ESD event by the ESD event trigger by electrically connecting the ESD power supply bus and said analog ground substrate. Each I/O pad is capacitively coupled to the ESD power supply bus in order to protect any internal circuitry that is coupled to the I/O pad from damage due to ESD events. Protected internal circuitry is coupled to either the digital power supply bus and digital ground substrate, or the analog power supply bus and analog ground substrate, but is electrically isolated from the ESD power supply bus.

The use of a separate ESD power supply bus allows the digital and analog power supply busses to be routed only along the portion of the IC where the respective digital and analog I/O pads reside. This configuration prevents digital noise carried on the digital power supply bus from coupling into analog circuitry which is located away from the digital portion of the IC. In addition, the ESD protection device of the invention requires no additional space.

BRIEF DESCRIPTION OF THE DRAWINGS

The invention will be better understood from a reading of the following detailed description taken in conjunction with the drawing in which like reference designators are used to designate like elements, and in which.

DETAILED DESCRIPTION

For a more comprehensive understanding of the advantages conferred by the present invention, the following contains a description of two different prior art approaches to ESD protection of mixed signal integrated circuit I/O pads.

Figure 1:
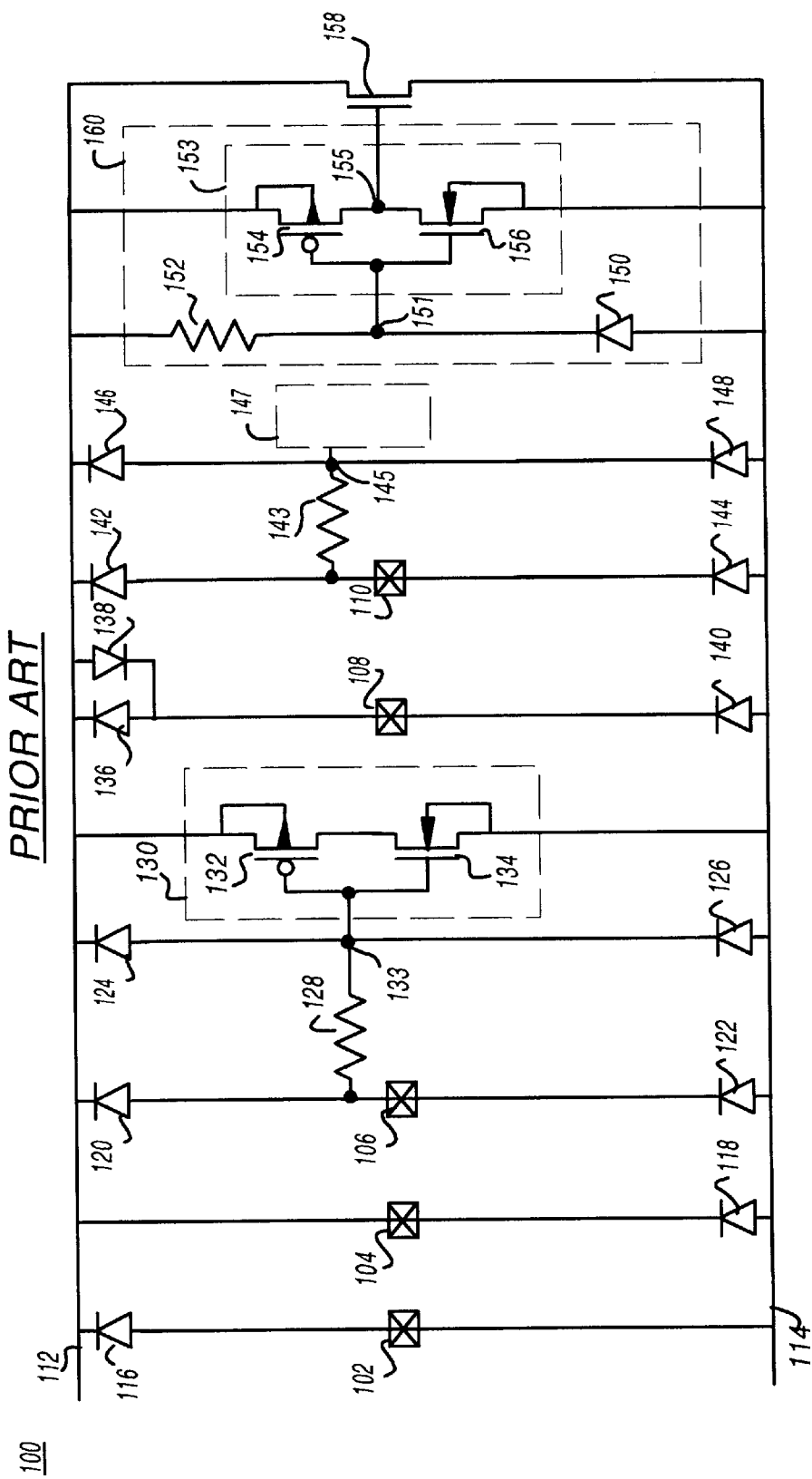
FIG. 1 is a schematic diagram of a first embodiment of a prior art ESD protection device.

FIG. 1 is a schematic diagram of a first prior art ESD protection device 100 for an IC having both digital and analog, or "mixed signal", I/O pads. In ESD protection device 100, respective digital I/O pad 106 and analog I/O pad 110 are each diode coupled between power supply bus 112 and ground 114. Internal digital circuitry 130 is coupled to digital I/O pad 106 via resistor 128 at internal node 133. Node 133 is also diode coupled between power supply bus 112 and ground 114 via respective diodes 124 and 126. Similarly, internal analog circuitry 147 to be protected is coupled to analog I/O pad 110 via resistor 143 via a connection to internal node 145. Internal node 145 is also diode coupled between power supply bus 112 and ground 114 via respective diodes 146 and 148. An ESD event trigger 160 is coupled in parallel with an ESD shunt device 158 between power supply bus 112 and ground 114. ESD event trigger 160 operates to turn on ESD shunt device 158 to effectively create a temporary short between power supply bus 112 and ground 114 when rapidly rising voltage appears on power supply bus 112. ESD event trigger 160 is tunable via sizing of ESD event trigger 160 components. ESD event trigger 160 includes a resistor 152 coupled at intermediate node 151 in series with diode 150 between power supply bus 112 and ground 114. ESD event trigger 160 also includes a FET switching device 153, comprising N-type Field Effect Transistor (NFET) 156 and P-type Field Effect Transistor (PFET) 154, coupled at output node 155 in series between power supply bus 112 and ground. The gate of each FET 154 and 156 is controlled via the voltage on input node 151. Resistor 152 and diode 150 are sized to hold the voltage at input node 151, under normal conditions, to a high enough level to keep NFET 156 on and PFET 154 off. This results in the voltage level on output node 155 being low enough that ESD shunt 158 is off, which effectively creates an open circuit between power supply bus 112 and ground 114. PFET 154 is generally sized much larger than NFET 156 in order to provide fast turn-on of the shunt device 158 when an ESD event is present. The resistor 152 and diode 150 act as an RC time constant which can be sized to trigger shunt device 158 when fast rising power supply voltages, which are characteristic of an ESD event, are present. Care must be taken not to size the RC filter too large as to cause shorting of the supplies with regular power supply energization.

When an ESD event occurs between two pads, e.g., between digital I/O pad 106 and analog I/O pad 110, the ESD current $I_{ESD}$ must be dissipated or damage occurs to the internal circuitry 130 and/or 147 (coupled at node 133 or 145, respectively). Accordingly, ESD protection circuit 100 employs the power supply bus 112 and ground substrate 114 as the ESD event carrying path. The ESD current $I_{ESD}$ enters the I/O pad 106 or 110, flows through diodes 120 or 142, respectively, to power supply bus 112, which triggers ESD event trigger 160 to turn on shunt 158 to create a short between power supply bus 112 and ground 114. The ESD current $I_{ESD}$ then flows through shunt 158 to ground 114 and completes the circuit by flowing through respective diodes 122 or 144 back to the I/O pad 106 or 110. In order to actually protect the internal circuitry 130 or 147 from damage due to an ESD event, the voltage drop around the ESD event carrying path must be maintained below the breakdown voltage $V_{breakdown}$ of the silicon junctions or the CMOS gate during the ESD event. The voltage drop is the sum of the threshold voltages for the entering diode 120 or 142, the exiting diode 122 or 144, the IR drop across shunt 158 when shunt 158 is on, and the IR voltage drop across power supply bus 112 and ground substrate 114 when ESD current $I_{ESD}$ flows across the parasitic resistances $R_{VDD}$ and $R_{GND}$. In CMOS chips, power supply bus 112 is typically configured as a ring around the entire chip. This configuration places the power supply bus 112 in close proximity to each I/O pad of the IC, which lowers the parasitic resistance of the power bus 112. In a mixed digital and analog IC, the digital power supply is typically used as the ESD event carrying path even for analog I/O pads since there are typically more digital I/O pads than analog I/O pads. This approach to ESD protection in mixed digital and analog ICs has the disadvantage of spreading noise carried by the digital power supply bus 112 into the analog area of the chip. The PFET 132 and NFET 134 combination shown in digital circuitry 130 is typically employed in output driver circuitry for digital output pads. When the PFET 132 and NFET 134 combination is in a stable state (i.e., either high "1" or low "0"), the static current is zero. As I/O pad 106 is switched from low to high, or from high to low, a period of time exists when both FETs 132 and 134 are on simultaneously, resulting in a large crossover shorting current in addition to the large charging and discharging current on node 133 and therefore a large current spike on digital power supply bus 112. The internal digital circuitry is designed to tolerate these spikes. However, this type of noise can significantly degrade the performance of sensitive analog circuitry. Noise caused by high speed switching of digital output drivers is carried by digital power supply bus 112, rendering it difficult to shield sensitive analog circuitry which is located near power supply bus 112 from this noise. Noise in mixed mode chips tends to decrease exponentially away from the noise source. Thus, the closer a device is to the noise source, the more the noise couples into the signals of the device. Conversely, the further away a device is from the noise source, the less coupling occurs, until at a certain point, the noise becomes nearly constant, which is attributable to the noise in the ground substrate or in that part of the circuit that is common to all devices. Accordingly, by ringing the IC with the digital power supply bus 112, noise from bus 112 is spread to and coupled into the analog portion of the IC. Thus, the ESD protection device 100 is unattractive for mixed signal ICs which have large areas of sensitive analog circuitry with no digital I/O pads near them which require access to the digital power supply bus 112.

If instead power supply bus 112 for carrying ESD events were chosen to be a separate but clean analog power supply, the direct distribution of digital noise to the analog circuitry via the digital power supply bus would be eliminated. However, in such an implementation, the analog power supply would instead traverse each of the digital I/O pads 106 of the mixed mode circuit, thereby operating as a significant coupling point for digital noise present on the digital I/O pads onto analog power supply bus 112.

Figure 2:
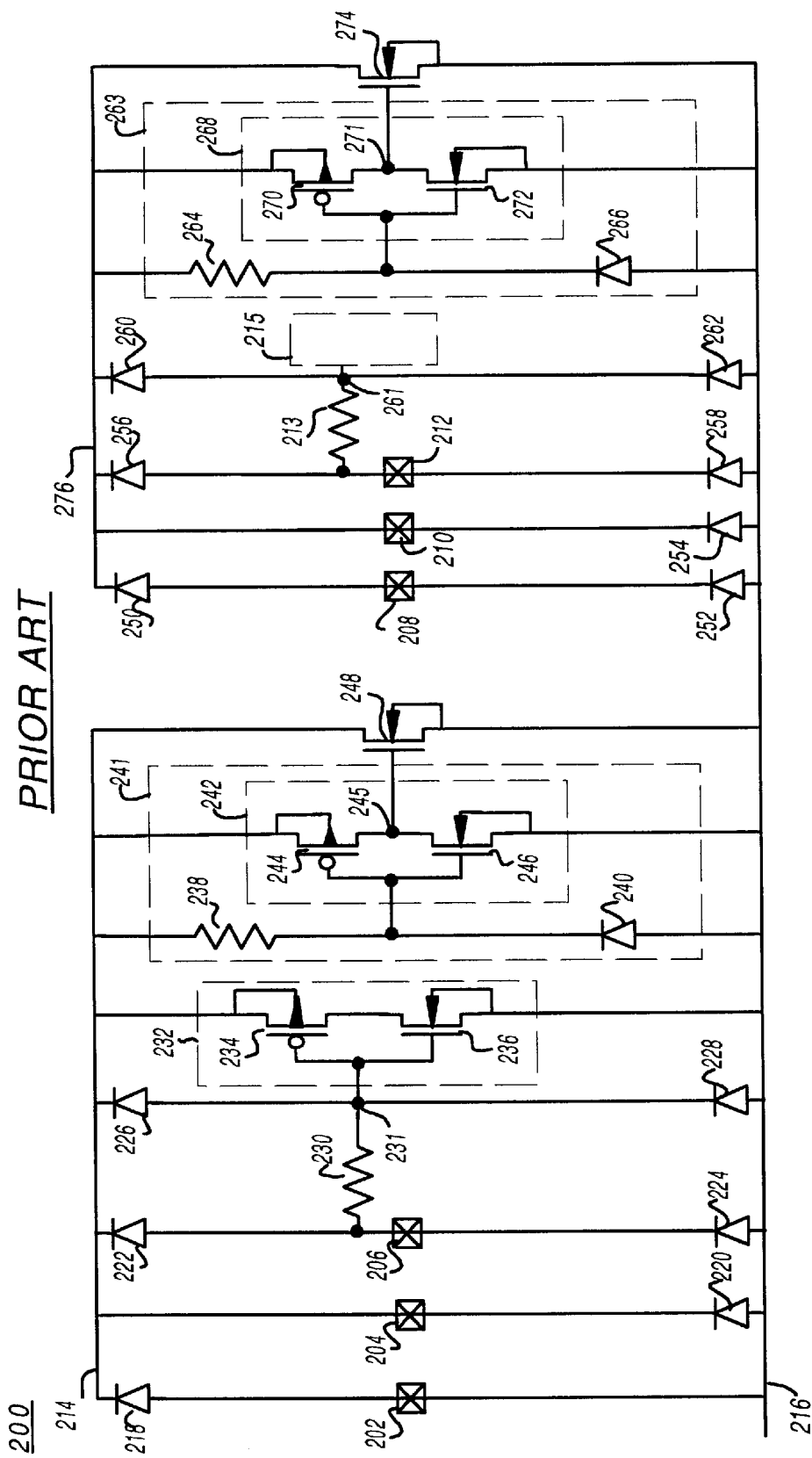
FIG. 2 is a schematic diagram of a second embodiment of a prior art ESD protection device.

FIG. 2 is a schematic diagram of an alternative prior art ESD protection device 200 for mixed signal I/O pads of an integrated circuit. ESD protection device 200 employs split bussing to prevent digital noise caused by high speed switching of output drivers and carried over digital power supply bus from coupling into those analog portions of the circuit which are located away from any digital I/O pads. In ESD protection device 200, digital I/O pad 206 is diode coupled between power supply bus 214 and ground 216 via respective diodes 222 and 224. Internal digital circuitry 232 is coupled to digital I/O pad 206 via resistor 230 via a connection to internal node 231. Node 231 is also diode coupled between digital power supply bus 214 and ground 216 via respective diodes 226 and 228. An ESD event trigger 241 is coupled in parallel with an ESD shunt device 248 between digital power supply bus 214 and ground 216. ESD event trigger 241 includes similar components as, and operates similarly to, the ESD event trigger 160 of FIG. 1.

Unlike in the ESD protection device 100 of FIG. 1, however, analog I/O pad 212 is diode coupled between a separate clean analog power supply bus 276 and ground 216 via respective diodes 256 and 258. Analog circuitry to be protected 215 is coupled to analog I/O pad 212 via resistor 213 via a connection to internal node 261. Node 261 is also diode coupled between analog power supply bus 276 and ground 216 via respective diodes 260 and 262. A separate ESD event trigger 263 is coupled in parallel with an ESD shunt device 274 between analog power supply bus 276 and ground 216. ESD event trigger 263 includes similar components as, and operates similarly to, the ESD event trigger 160 of FIG. 1.

When an ESD event occurs between one of the digital I/O pads 206 and one of the analog I/O pads 212, ESD protection circuit 200 employs the digital power supply bus 214 and ground substrate 216 as the ESD event carrying path. The ESD current $I_{ESD}$ enters I/O pad 206, flows through diode 222 to power supply bus 214, which triggers ESD event trigger 241 to turn on shunt 248 and short digital power supply bus 214 and ground 216. The ESD current $I_{ESD}$ then flows through shunt 248 to ground 216 and completes the circuit by flowing through diode 258 to analog I/O pad 212.

When an ESD event occurs between one of the analog I/O pads 212 and one of the digital pads 206, ESD protection circuit 200 employs the analog power supply bus 276 and ground substrate 216 as the ESD event carrying path. The ESD current $I_{ESD}$ enters analog I/O pad 212, flows through diode 256 to analog power supply bus 276, which triggers ESD event trigger 263 to turn on shunt 274 and short analog power supply bus 276 and ground 216. The ESD current $I_{ESD}$ then flows through shunt 274 to ground 216 and completes the circuit by flowing through diode 224 to digital I/O pad 206.

The split bussing approach of ESD protection device 200 requires the number of ESD event triggers and shunting devices to be doubled for the same IR drop in the circuit, and especially since the core shunt devices are quite large compared to the size of other circuitry, results in a significant increase in the area of the IC. During design and test of an IC which employs the ESD protection device 200, split bussing also forces the design engineer into evaluating two separate ESD networks tied to a common ground substrate. During the chip layout stage of fabrication, the stubs caused by the isolation of the digital and analog ESD power supply busses must be carefully analyzed for IR drop due to single direction current paths.

The present invention eliminates the need for separate digital and analog shunt supplies while maintaining good separation of digital noise from sensitive analog circuitry that is located away from the digital drivers and core, by utilizing a separate power supply bus for the upper ESD power supply bus. The separate ESD power supply bus is not connected to any of the internal circuitry, but to ESD protecting devices only.

Figure 3:
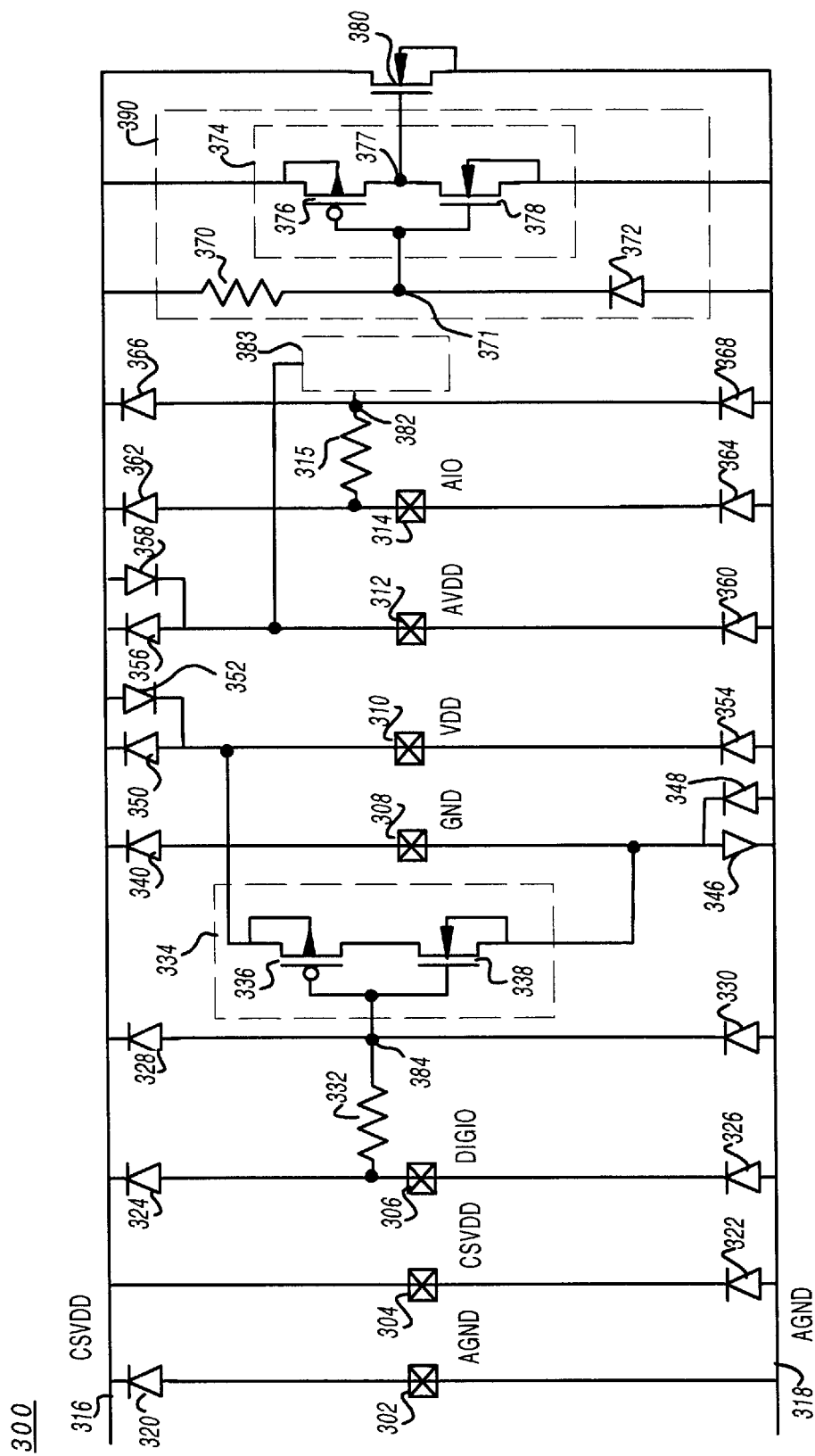
FIG. 3 is a schematic diagram of an ESD protection device in accordance with the invention.

FIG. 3 is a schematic diagram of an ESD protection circuit 300 in accordance with the invention. In ESD protection device 300, respective digital I/O pad 306 and analog I/O pad 314 are each diode coupled between a separate ESD power supply bus via respective diodes 324 and 362 316 and ground 318 via respective diodes 326 and 364. Internal digital circuitry 334 is coupled to digital I/O pad 306 via resistor 332 via a connection to internal node 384. Node 384 is also diode coupled between ESD power supply bus 316 and ground 318 via respective diodes 328 and 330. Internal digital circuitry 334 is powered and grounded via coupling to digital power supply bus (shown as digital power supply pad 310) and digital ground (shown as digital ground pad 308). Similarly, analog circuitry to be protected is coupled to analog I/O pad 314 via resistor 315 via a connection to internal node 382. Internal nodes 332 and 382 are also diode coupled between ESD power supply bus 316 and ground 318 via respective diodes 330 and 368. Internal analog circuitry connected at node 383 is powered and grounded via coupling to a separate analog power supply bus (shown as analog power supply pad 312) and analog ground 318 (which is used as part of the ESD carrying path). An ESD event trigger 390 is coupled in parallel with an ESD shunt device 380 between ESD power supply bus 316 and ground 318. ESD event trigger 390 operates to turn on ESD shunt device 380 to effectively create a temporary short between ESD power supply bus 316 and ground 318 when rapidly rising voltage appears on ESD power supply bus 316. ESD event trigger 390 is tunable via sizing of ESD event trigger 390 components, including resistor 370 coupled in series with diode 372 at node 371 between ESD power supply bus 316 and ground 318, and FET switching device 374, which includes NFET 378 and PFET 376 coupled in series at output node 377 between ESD power supply bus 316 and ground 318, with each gate coupled to node 371. ESD event trigger 390 operates similarly to ESD event trigger 160 of FIG. 1, and is described previously.

All power supplies busses are capacitively coupled together. Accordingly, digital power supply bus 310 and analog power supply bus 312 are each diode connected into ESD power supply bus 316 via back-to-back diodes 350 and 352, and 356 and 358, respectively. Under normal operation, ESD power supply bus 316 is at the same voltage potential as both digital power supply bus 310 and analog power supply bus 312. Any voltage differential or fluctuation caused by charging and discharging of the digital circuitry is capacitively coupled up to ESD power supply bus 316. However, diode 350 operates as a capacitive coupling device, which attenuates the amount of fluctuation seen by the ESD power supply bus 316. Since ESD power supply bus 316 is capacitively coupled to analog power supply bus 312, any fluctuation seen on analog power supply bus 312 which is caused by fluctuation on the ESD power supply bus 316 is attenuated. Thus, via the capacitive coupling up to ESD power supply bus 316 and the capacitive coupling down to analog power supply 312, any supply noise is attenuated. Following the same line of reasoning, via the capacitive coupling up to ESD power supply bus 316 and the capacitive coupling down to analog power supply 312, any capacitive noise in this direction is also attenuated.

In the preferred embodiment of the invention, digital power supply bus 310 is configured to be in close proximity only with digital I/O pads. A clean analog power supply bus is configured to be in close proximity only to the analog I/O pads. Neither digital power supply bus 310 nor analog power supply bus 312 are included in the ESD event carrying path—that is, ESD current $I_{ESD}$ flows through neither power supply 310 nor 312. Furthermore, analog power supply bus 312 does not carry the digital noise caused by the charging and discharging current of digital I/O drivers and digital internal circuitry—instead, all of this noise is carried in the digital power supply bus 310, which is preferably far removed from sensitive analog circuitry.

A separate analog ground substrate 318 is common to all the I/O pads to provide a diode connection back to the I/O pad signals in order to complete circuit for the ESD event carrying path. This is process dependent. In a trench isolated silicon-on insulator (SOI) technology, this technique could be extended to have a separate lower ESD rail other than ground substrate AGND 318.

When an ESD event occurs between I/O pads 306 or 314, ESD protection circuit 300 employs the ESD power supply bus 316 and ground substrate 318 as the ESD event carrying path. The ESD current $I_{ESD}$ enters the I/O pad 306 or 314, flows through diodes 324 or 362, respectively, to ESD power supply bus 316, which triggers ESD trigger 390 to turn on shunt 380 and short the ESD power supply bus 316 and analog ground 318. The ESD current $I_{ESD}$ then flows through shunt 380 to analog ground 318 and completes the circuit by flowing through respective diodes 326 or 364 back to the I/O pad 306 or 314. The voltage drop around the loop is maintained below breakdown ($V_{breakdown}$) during the ESD event for protection of the internal circuits.

It will be appreciated from the above description and from an examination of ESD protection circuit 300 that because the core shunts are single rail, a lower shunt resistance is possible for a given area of the IC dedicated to the shunts. The lack of drivers on the ESD power supply bus 316 eliminates the large current pulses needed for charging and discharging the load capacitances. The only currents flowing over ESD power supply bus 316 when the chip is in operation are the currents caused by coupling of the signals through the off capacitance of the protection diodes, which are orders of magnitude smaller than the charging currents mentioned above. The use of a single ESD power supply bus also enables the use of a standard cell-based approach to pad frame development. ESD power supply bus 316 is ringed continuously around the chip and is not subject to broken stubs which have higher ESD path resistance due to the far proximity of the stub to the shunt. This continuous feature is desirable in the layout of pad frame. The internal power supplies can be broken for noise isolation without major impact to the ESD protection. This allows the analog and digital circuitry to be separated except for capacitive coupling to ground substrate 318 and ESD power supply bus 316.

What is claimed is:

1. An electro-static discharge (ESD) protection device for a mixed digital and analog signal integrated circuit (IC) which comprises an input and or output (I/O) pad, protected circuitry coupled to said I/O pad, a digital power supply bus, an analog power supply bus, and a ground substrate, comprising:
    an ESD power supply bus capacitively coupled to said I/O pad, said digital power supply bus, and said analog power supply bus;
    an ESD event trigger coupled between said ESD power supply bus and said ground substrate for detecting an ESD event, said ESD event defined by a rapidly rising spike present on said ESD power supply bus;
    a shunting device which is responsive to said ESD event trigger detecting said ESD event by electrically connecting said ESD power supply bus and said ground substrate.

2. An electro-static discharge (ESD) protection device in accordance with claim 1, wherein:
    said ESD event trigger comprises a CMOS inverter having an inverter input coupled to said ESD power supply bus and an output coupled to control said shunting device.

3. An electro-static discharge (ESD) protection device in accordance with claim 2, wherein:
    said inverter input is capacitively coupled to said ground substrate.

4. An electro-static discharge (ESD) protection device in accordance with claim 1, wherein:
    said I/O pad comprises a digital I/O pad and said protected circuitry comprises digital circuitry coupled to said digital power supply bus and said ground substrate.

5. An electro-static discharge (ESD) protection device in accordance with claim 1, wherein:
    said I/O pad comprises an analog I/O pad and said protected circuitry comprises analog circuitry coupled to said analog power supply bus and said ground substrate.

6. An electro-static discharge (ESD) protection device in accordance with claim 1, wherein:
    said IC comprises at least one other I/O pad capacitively coupled to said ESD power supply bus and said ground substrate.

7. An electro-static discharge (ESD) protection device in accordance with claim 6, wherein:
    said at least one other I/O pad comprises a digital I/O pad and said protected circuitry comprises digital circuitry coupled to said digital power supply bus and said ground substrate.

8. An electro-static discharge (ESD) protection device in accordance with claim 6, wherein:
    said at least one other I/O pad comprises an analog I/O pad and said protected circuitry comprises analog circuitry coupled to said analog power supply bus and said ground substrate.

9. An electrostatic discharge (ESD) protection device in accordance with claim 6, wherein:
    said I/O pad comprises a digital I/O pad and said protected circuitry comprises digital circuitry coupled to said digital power supply bus and said ground substrate; and
    said at least one other I/O pad comprises an analog I/O pad and said protected circuitry comprises analog circuitry coupled to said analog power supply bus and said ground substrate.

10. An electro-static discharge (ESD) protection device for a mixed digital and analog signal integrated circuit (IC) which comprises an input and or output (I/O), protected circuitry coupled to said I/O pad, a digital power supply bus, an analog power supply bus, a digital ground substrate, and an analog ground substrate capacitively coupled to said digital ground substrate, comprising:
    an ESD power supply bus capacitively coupled to said I/O pad, said digital power supply bus, and said analog power supply bus;
    an ESD event trigger coupled between said ESD power supply bus and said analog ground substrate for detecting an ESD event, said ESD event defined by a rapidly rising spike present on said ESD power supply bus;
    a shunting device which is responsive to said ESD event trigger detecting said ESD event by electrically connecting said ESD power supply bus and said analog ground substrate.

11. An electro-static discharge (ESD) protection device in accordance with claim 10, wherein:
    said ESD event trigger comprises a CMOS inverter having an inverter input coupled to said ESD power supply bus and an output coupled to control said shunting device.

12. An electro-static discharge (ESD) protection device in accordance with claim 11, wherein:
    said inverter input is capacitively coupled to said analog ground substrate.

13. An electro-static discharge (ESD) protection device in accordance with claim 10, wherein:
    said I/O pad comprises a digital I/O pad and said protected circuitry comprises digital circuitry coupled to said digital power supply bus and said digital ground substrate.

14. An electro-static discharge (ESD) protection device in accordance with claim 10, wherein:
    said I/O pad comprises a analog I/O pad and said protected circuitry comprises analog circuitry coupled to said analog power supply bus and said analog ground substrate.

15. An electro-static discharge (ESD) protection device in accordance with claim 10, comprising:
    at least one other I/O pad capacitively coupled to said ESD power supply bus and said analog ground substrate.

16. An electro-static discharge (ESD) protection device in accordance with claim 15, wherein:
    said at least one other I/O pad comprises a digital I/O pad and said protected circuitry comprises digital circuitry coupled to said digital power supply bus and said digital ground substrate.

17. An electro-static discharge (ESD) protection device in accordance with claim 15, wherein:

said at least one other I/O pad comprises an analog I/O pad and said protected circuitry comprises analog circuitry coupled to said analog power supply bus and said analog ground substrate.

18. An electro-static discharge (ESD) protection device in accordance with claim 15, wherein:

said I/O pad comprises a digital I/O pad and said protected circuitry comprises digital circuitry coupled to said digital power supply bus and said digital ground substrate; and said at least one other I/O pad comprises an analog I/O pad and said protected circuitry comprises analog circuitry coupled to said analog power supply bus and said analog ground substrate.

19. An electro-static discharge (ESD) protected integrated circuit (IC), comprising:

a digital power supply bus;

an analog power supply bus;

a digital ground substrate;

an analog ground substrate capacitively coupled to said digital ground substrate;

an ESD power supply bus capacitively coupled to said digital power supply bus and said analog power supply bus;

a digital I/O pad capacitively coupled to said ESD power supply bus and said analog ground substrate;

protected internal digital circuitry coupled to said digital power supply bus, said digital ground substrate, and said digital I/O pad, which is electrically isolated from said ESD power supply bus;

a analog I/O pad capacitively coupled to said ESD power supply bus and said analog ground substrate;

protected internal analog circuitry coupled to said analog power supply bus, said analog ground substrate, and said analog I/O pad, which is electrically isolated from said ESD power supply bus;

an ESD event trigger coupled between said ESD power supply bus and said analog ground substrate for detecting an ESD event, said ESD event defined by a high-voltage high-current spike present on said ESD power supply bus; and a shunting device which is responsive to said ESD event trigger detecting said ESD event by electrically connecting said ESD power supply bus and said analog ground substrate.

* * * * *